United States Patent [19]

Reber et al.

[11] 3,767,979

[45] Oct. 23, 1973

[54] MICROWAVE HERMETIC TRANSISTOR PACKAGE

[75] Inventors: Robert L. Reber, Sunnyvale; David M. Duncan, San Francisco, both of Calif.

[73] Assignee: Communications Transistor Corporation, San Carlos, Calif.

[22] Filed: Mar. 5, 1971

[21] Appl. No.: 121,511

[52] U.S. Cl. ..... 317/234 R, 317/234 G, 317/234 N, 174/52 S

[51] Int. Cl. ..... H01l 5/00, H01l 3/00

[58] Field of Search ..... 317/234, 4, 4.1, 317/5.4, 1.5; 174/52 R, 52 S

[56] References Cited

UNITED STATES PATENTS

| | | | |
|---|---|---|---|
| 3,404,215 | 10/1968 | Burks et al. | 317/234 H |
| 3,478,161 | 11/1969 | Carley | 317/234 G |
| 3,479,570 | 11/1969 | Gilbert | 317/234 A |
| 3,515,952 | 6/1970 | Robinson | 317/234 G |
| 3,544,859 | 12/1970 | Tijburg et al. | 317/234 L |
| 3,577,181 | 5/1971 | Belohoubek | 317/234 A |
| 3,611,059 | 10/1971 | Carley | 317/234 G |
| 3,271,634 | 9/1966 | Heaton | 317/234 |
| 3,404,214 | 10/1968 | Elliott | 317/234 G |
| 3,651,434 | 3/1972 | McGeough et al. | 317/234 G |

*Primary Examiner*—John W. Huckert
*Assistant Examiner*—Andrew J. James
*Attorney*—Stanley Z. Cole

[57] ABSTRACT

A ceramic stripline structure having an input stripline and an output stripline is mounted upon an electrically and thermally conductive base structure for attachment to a heat sink. A hollow ceramic cylinder is bonded at one end to the base structure in surrounding relation to the stripline structure. The ceramic cylinder is slotted on opposite sides for passage of input and output strip conductive leads therethrough for connection to the input and output striplines within the package. The input and output strip conductive leads are hermetically sealed to the ceramic cylinder. A transistor die is mounted over the stripline structure and a kovar metal cap is hermetically sealed over the end of the ceramic cylinder to provide a hermetically sealed all ceramic-to-metal transistor package.

9 Claims, 4 Drawing Figures

INVENTORS
ROBERT L. REBER
DAVID M. DUNCAN

BY Stanley Z. Cole

ATTORNEY

MICROWAVE HERMETIC TRANSISTOR PACKAGE

DESCRIPTION OF THE PRIOR ART

Heretofore, high frequency transistor packages have employed a metalized stripline circuit portions with a transistor die mounted over the stripline. A ceramic cup-shaped cap was hermetically sealed over the stripline circuit. However, the ceramic cap was sealed to the metalized ceramic substrate member by means of an epoxy or glass having relatively poor thermal and r.f. electrical conductivity and questionable hermeticity and reliability, as contrasted with an all ceramic-to-metal package configuration.

SUMMARY OF THE PRESENT INVENTION

The principal object of the present invention is the provision of an improved high frequency transistor package.

In one feature of the present invention, a hollow ceramic cylinder is bonded at one end to and in upstanding relation from an electrically conductive base structure which in-turn is formed and arranged to be attached to a suitable heat sink structure. The ceramic cylinder is slotted at circumferentially spaced positions to receive input and output strip conductive leads passing through the respective slots in the ceramic cylinder. The leads are hermetically sealed to the slots, whereby fabrication of an all ceramic-to-metal transistor package is facilitated.

In another feature of the present invention, solid dielectric filled microstrip line input and output circuits are mounted within the ceramic cylinder, such stripline including input and output strip conductors overlaying a common conductor and wherein the input and output strip leads which pass through the slotted ceramic cylinder are bonded to the respective stripline conductors of the stripline circuits inside of the ceramic cylinder.

In another feature of the present invention, a metallic cap closes off the upper end of the ceramic cylinder for enclosing a transistor die as mounted over the stripline circuit, such cap being bonded to a metalized end surface of the ceramic cylinder to form a hermetic seal therebetween, and wherein metalized strips on the ceramic cylinder interconnect the metallic cap and the common conductor of the stripline circuit, whereby the cap is operated at a potential common to the ground plane of the stripline circuit.

In another feature of the present invention the stripline circuit is formed by metalized layers on a ceramic wafer such metalized layers including an input strip conductor, an output strip conductor and a common strip conductor underlying both the input and output strip conductors.

Other features and advantages of the present invention will become apparent upon perusal of the following specification taken in connection with the accompanying drawings, wherein:

DESCRIPTION OF THE PREFERRED EMBODIMENTS

Figure 1:
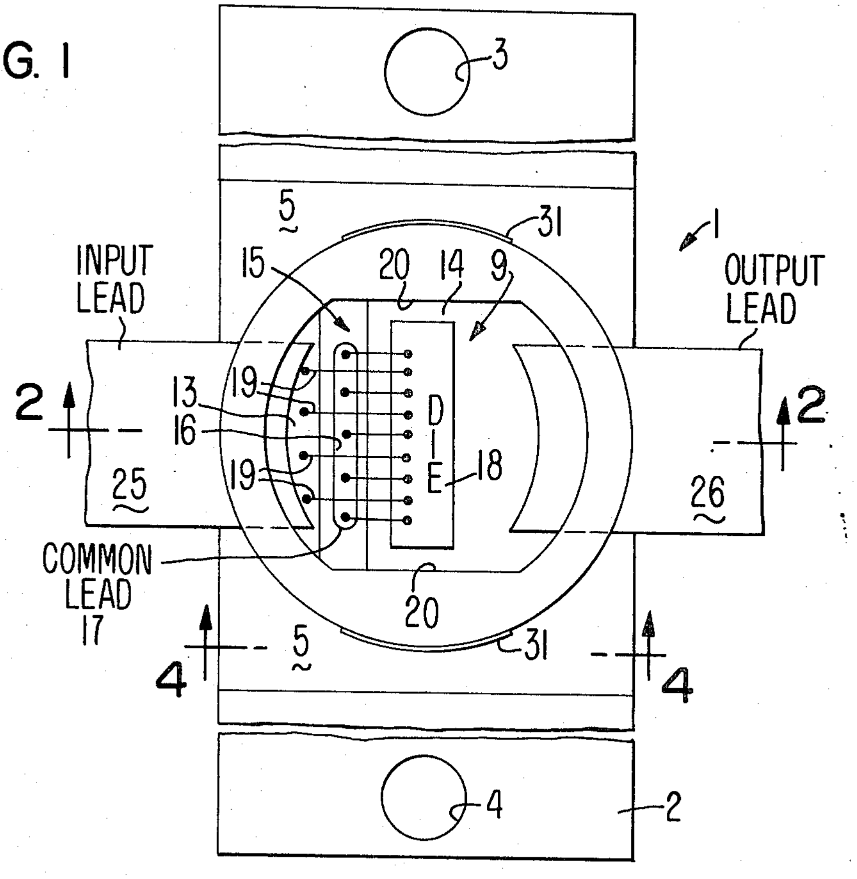
FIG. 1 is a plan view, partially broken away, of a transistor package incorporating features of the present invention.
Figure 2:
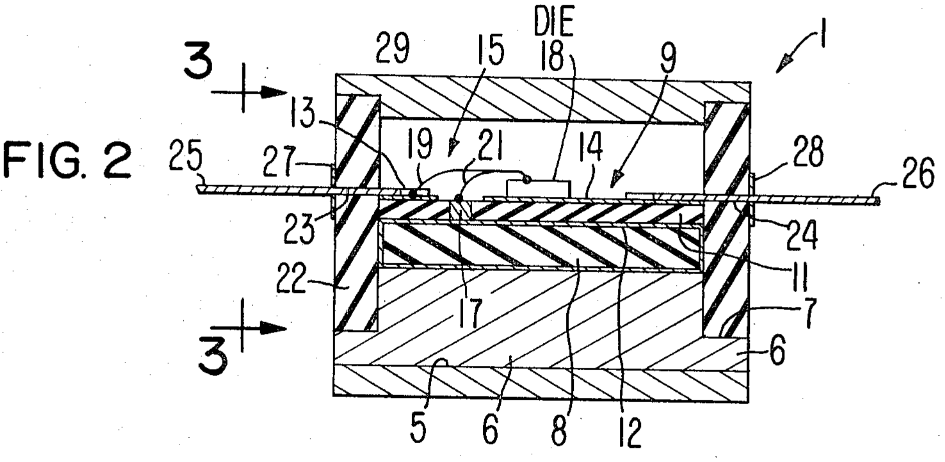
FIG. 2 is a sectional view of the structure of FIG. 1 taken along line 2—2 in the direction of the arrows.

Referring now to FIGS. 1 and 2, there is shown the stripline transistor package 1 of the present invention. The stripline package 1 includes a metallic heat sinking flange structure 2 of generally rectangular configuration having a pair of mounting holes 3 and 4 at opposite ends and a recessed central portion 5.

A disc-shaped electrically conductive base structure 6, as of copper, is brazed at its bottom surface to the recessed portion 5 of the flange 2. In a typical embodiment, the base structure 6 is a circular disc, as of 0.250 inch diameter, 0.080 inch thickness, and having a recessed shoulder extending around its periphery, such shoulder having a height of 0.040 inch from the bottom surface of the base 6 and having a radial depth of 0.025 inch. In this manner, the center disc portion of the base structure has an outer diameter of 0.200 inch. A metalized ceramic mounting wafer 8, as of beryllia or alumina, is brazed to the upper surface of the base structure 6. In a typical example, the mounting wafer 8 has an outside diameter of 0.200 inch and a thickness of 0.020 inch. The mounting wafer is metalized over its entire surface such as to form an extension of the base structure 6.

A solid-dielectric filled microstrip line structure 9 is brazed over the mounting wafer 8. The microstrip line 9 is formed by a metalized ceramic wafer 11, as of beryllia ceramic, metalized over its entire lower surface at 12 to form a ground plane member of the stripline structure 9 and metalized with two strip conductors on the top surface at 13 and 14 to form input and output strip conductors 13 and 14, respectively. Thus, the stripline structure 9 includes an input stripline portion and an output stripline portion, such input and output stripline portions being defined by that region of the stripline structure 9 underlaying the respective input and output strip conductors 13 and 14.

In a typical example, the metalized input and output conductors 13 and 14 comprise metalized molybdenum-manganese plated with gold to an overall thickness of 0.001 inch. The input and output strip conductors 13 and 14 are spaced apart at their inner ends to define an elongated gap 15 therebetween. In a typical example, the gap 15 has a width of 0.035 inch and a length, as of 0.175 inch. The ceramic wafer 11 is slotted with a slot 16 extending longitudinally at the gap 15. In a typical example, slot 16 has a width of 0.015 inch and a length as of 0.115 inch. An electrically conductive wire 17 is disposed in the slot 16 and substantially fills the slot 16 and is brazed along its lower side to the common conductive layer 12 of the stripline 9.

A transistor die 18, as of 0.035 inch wide by 0.090 inch long by 0.003 inch thick, is mounted over the output strip conductor 14 of the output stripline portion. The die 18 includes base and emitter electrode structures on the upper top surface thereof and a collector electrode structure on the lower or bottom surface thereof adjacent the strip conductor 14. The collector electrode structure of the die 18 is bonded to the output strip conductor 14 to provide an electrically conductive and thermally conductive bond therebetween.

The base and emitter electrodes each include a plurality of pad portions to which leads may be bonded. A first set of leads 19 are bonded between the input strip conductor 13 and the base or emitter pads of the transistor die 18, depending upon whether a common emitter or common base transistor configuration, respectively is desired. The second set of leads 21 are bonded between the common terminal strip 17 and the emitter or base pads of the transistor die 18, depending upon whether common emitter or a common base transistor configuration, respectively, is desired.

A hollow ceramic cylinder 22, as of beryllia or alumina ceramic is metalized at opposite ends and brazed at one end to the shoulder 7 of the base structure 6 to provide a thermally conductive hermetically sealed bond therebetween. In a typical example, ceramic cylinder 22 has a length of 0.110 inch, a wall thickness of 0.025 inch, an inside diameter of 0.200 inch and an outside diameter of 0.250 inch. The inside wall of the ceramic cylinder 22 includes a pair of diametrically flat chord portions 20, for registration with corresponding flats on the periphery of the stripline slot 11, mounting wafer 8 and base 6 to assure proper alignment of the corresponding parts.

Figure 3:
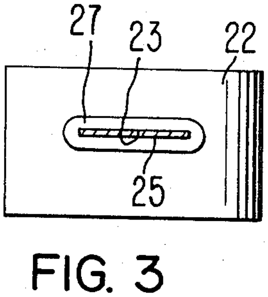
FIG. 3 is a detail view of a portion of the structure of FIG. 2 taken along line 3—3 in the direction of the arrows.

A pair of circumferentially directed slots 23 and 24 are cut through the cylinder 22 on opposite sides thereof. In a typical example, the slots 23 and 24 have a chord length, as of 0.130 inch, and a height of 0.010 inch and pass completely through the side wall of the cylinder 22. A region around each of the slots is metalized at 27 and 28, as shown in FIG. 3, for forming a metalized bond with a respective input lead and an output lead 25 and 26. Each lead has a thickness, as of 0.005 inch, and a width, as of 0.115 inch. The leads 25 and 26 pass through the respective slots 23 and 24 are bonded at their inner ends to the input strip conductor 13 and output strip conductor 14, respectively, to form extensions of the input and output stripline circuits. The input and output leads 25 and 26 are bonded to the metalized regions 27 and 28, respectively, to form hermetic seals between the leads and the cylinder 22.

Figure 4:
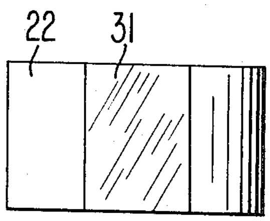
FIG. 4 is a detail view of a portion of the structure of FIG. 1 taken along line 4—4 in the direction of the arrows.

An electrically conductive cap 29, as of kovar, is bonded to the second metalized end of the ceramic cylinder 22 to form an hermetic metal-to-ceramic seal between the cap 29 and the cylinder 22 for enclosing the transistor circuit. A pair of metalized strips 31 are disposed on opposite sides of the cylinder 22 in approximate quadrature with the input and output leads, 25 and 26 to provide an electrical connection between the conductive base structure 6 and the conductive cap 29, whereby the cap is caused to operate at the same dc potential as the common conductor 12 of the stripline 9. See FIGS. 1 and 4.

The transistor package 1 which includes a transistor die bonded over a solid dielectric filled stripline structure with a common terminal strip in between the ends of the striplines, is disclosed and claimed in co-pending U.S. Pat. application No. 121,908 filed Mar. 8, 1971, and now issued as U.S. Pat. No. 3,683,241 on Aug. 8, 1972 and assigned to the same assignee as the present invention.

The advantage of the stripline transistor package 1 of the present invention is that the package 1 is more easily fabricated. More particularly, the slotted ceramic cylinder 22 is inserted onto the base structure 6, in a self-jugging manner, and then the mounting wafer 8 and the stripline wafer 11 are inserted within the cylinder 22. Leads 25 and 26 are inserted through the slotted side walls of the cylinder and the sub-assembly is brazed to form an integral all metal-to-ceramic structure. The transistor die is then mounted and leads 19 and 21 bonded. The cap 29 is then inserted onto the end of the cylinder and the final seal is made. The resultant transistor package 1 is an all ceramic-to-metal package having substantially improved hermeticity, reliability and ease of fabrication. The metal-to-ceramic joints provide relatively high thermal conductivity and high r.f. electrical conductivity, such that improved thermal and electrical performance is obtained.

As an alternative structure to that of FIGS. 1 and 2, the mounting wafer 8 may be omitted and the common terminal 17, formed as an integral upstanding member from the upper surface of the base 6. The metalized, dielectric stripline slab 11 is then brazed directly to the upper surface of the base 6 with the terminal 17 extending into the slot in the slab 11. In addition, the base 6 need not be brazed to flange 2 but may be brazed to a stud or merely employed as a "pill" package.

What is claimed is:

1. In a transistor package, an electrically conductive base structure for attachment to a heat sink structure, a hollow ceramic cylinder bonded at a first end to and upstanding from said conductive base structure, said ceramic cylinder being transversely slotted at circumferentially spaced points intermediate the length of said cylinder to define first and second elongated transverse slots through said cylinder, said cylinder having elongated first and second lip portions entirely encircling said respective first and second slots, input and output strip conductive leads passing through said respective transverse slots in said ceramic cylinder, and means hermetically sealing said strip leads to said lip portions of said ceramic cylinder.

2. The apparatus of claim 1 including a metalized ceramic mounting wafer bonded to said electrically conductive base structure, a solid dielectric filled stripline means bonded to a major face of said mounting wafer, said stripline means including an input conductor and an output conductor and a common conductor underlaying both said input and output conductors, said input and output conductors being spaced apart at their inner ends to define an elongated gap therebetween, an electrically conductive common terminal strip disposed in said gap and upstanding from said common conductor through an aperture in said solid dielectric fill of said stripline means, said input and output conductive leads being bonded at their inner ends to said input and output conductors, respectively, of said stripline means.

3. The apparatus of claim 1 including electrically conductive cover means hermetically sealed over and closing off the second end of said ceramic cylinder.

4. The apparatus of claim 1 wherein said means for hermetically sealing said strip leads to said ceramic cylinder includes metalized surface regions of said cylinder extending around said lips of said slots in said cylinder, and means for bonding said strip leads to said metalized lip region of said slots in said cylinder.

5. The apparatus of claim 3 therein said cover means for closing off the second end of said cylinder includes a metallic cap bonded to a metalized lip of said ceramic cylinder.

6. In a transistor package, an electrically conductive base structure for attachment to a heat sink structure, a hollow ceramic cylinder bonded at a first end to and upstanding from said conductive base structure, said ceramic cylinder being slotted at circumferentially spaced points, input and output strip conductive leads passing through said respective slots in said ceramic cylinder, means hermetically sealing said strip leads to said ceramic cylinder said means for hermetically sealing said strip leads to said ceramic cylinder including, metallized surface regions of said cylinder extending around the lip of said slots in said cylinder, means for bonding said strip leads to said metallized lip region of said slots in said cylinder, and at least one metallized strip disposed on and extending axially of said ceramic cylinder for electrically connecting said metallic cap to said electrically conductive base structure for operating said cap at the same dc potential as said base structure.

7. The apparatus of claim 2 wherein said solid dielectric filled stripline includes, a ceramic wafer having said input and output conductors metalized onto a major face thereof, said wafer having an elongated slot therethrough in the gap region thereof between the opposed inner ends of said metalized input and output conductors, said common conductor of said stripline means comprising a metalized layer on a second major face of said wafer which is opposed to and underlaying said first major face, and wherein said common conductor terminal strip is disposed in said elongated slot in said wafer.

8. The apparatus of claim 2 including transistor die means mounted overlaying said stripline means and having a collector electrode structure, and means for connecting said collector electrode structure of said die to said output strip conductor.

9. The apparatus of claim 1 wherein said base structure includes a shoulder portion extending around the periphery of said base structure, and wherein said first end of said ceramic cylinder is metalized and bonded to said shoulder portion of said base structure.

* * * * *